(12) United States Patent
Taniguchi et al.

(10) Patent No.: US 8,148,238 B2
(45) Date of Patent: Apr. 3, 2012

(54) METHOD OF MANUFACTURING SEMICONDUCTOR DEVICE

(75) Inventors: Satoshi Taniguchi, Kanagawa (JP); Nobuhiro Suzuki, Kanagawa (JP); Hideki Ono, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/379,827

(22) Filed: Mar. 3, 2009

(65) Prior Publication Data

US 2009/0253249 A1    Oct. 8, 2009

(30) Foreign Application Priority Data

Apr. 7, 2008    (JP) .................................. 2008-099242

(51) Int. Cl.
 *H01L 21/30* (2006.01)
(52) U.S. Cl. .................. 438/458; 438/459; 257/E21.09
(58) Field of Classification Search .................. 438/478, 438/455, 458, 459; 257/E21.09
See application file for complete search history.

(56) References Cited

U.S. PATENT DOCUMENTS

| | | | |
|---|---|---|---|
| 5,641,381 A * | 6/1997 | Bailey et al. | 438/455 |
| 2006/0126689 A1 * | 6/2006 | Hong et al. | 372/43.01 |

FOREIGN PATENT DOCUMENTS

| | | |
|---|---|---|
| JP | 61-110470 A | 5/1986 |
| JP | 01-241166 A | 9/1989 |
| JP | 07-135194 A | 5/1995 |
| JP | 2001-068783 A | 3/2001 |
| JP | 2008-258563 * | 10/2008 |

OTHER PUBLICATIONS

M. Tong et al., "InAlAs/InGaAs/InP MODFET's with Uniform Threshold Voltage Obtained by Selective Wet Gate Recess", IEEE Electron Device Letters, vol. 13, No. 10, Oct. 1992, pp. 525-527.

* cited by examiner

*Primary Examiner* — Jack Chen
(74) *Attorney, Agent, or Firm* — Rader, Fishman & Grauer PLLC

(57) ABSTRACT

There is provided a method of manufacturing a semiconductor device which, in the case where an InP-based device is formed with a sacrificial layer in between, is capable of obtaining better device characteristics than those in the case where an AlAs single layer is used as the sacrificial layer, and which does not have the possibility that the device layer is etched together with the sacrificial layer during etching of the sacrificial layer. A method of manufacturing a semiconductor device includes: a formation step of forming a sacrificial layer which is pseudomorphic to InP on an InP substrate, and then forming an InP-based device layer on the sacrificial layer; and a separation step of separating the InP substrate and the device layer from each other by etching the sacrificial layer.

9 Claims, 14 Drawing Sheets

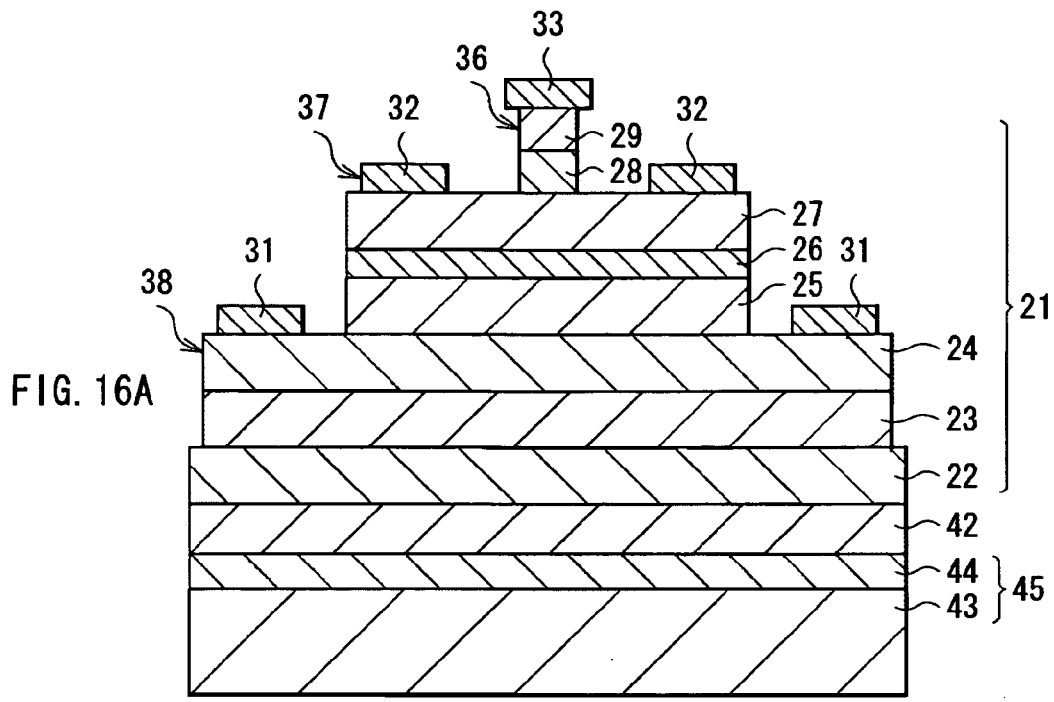
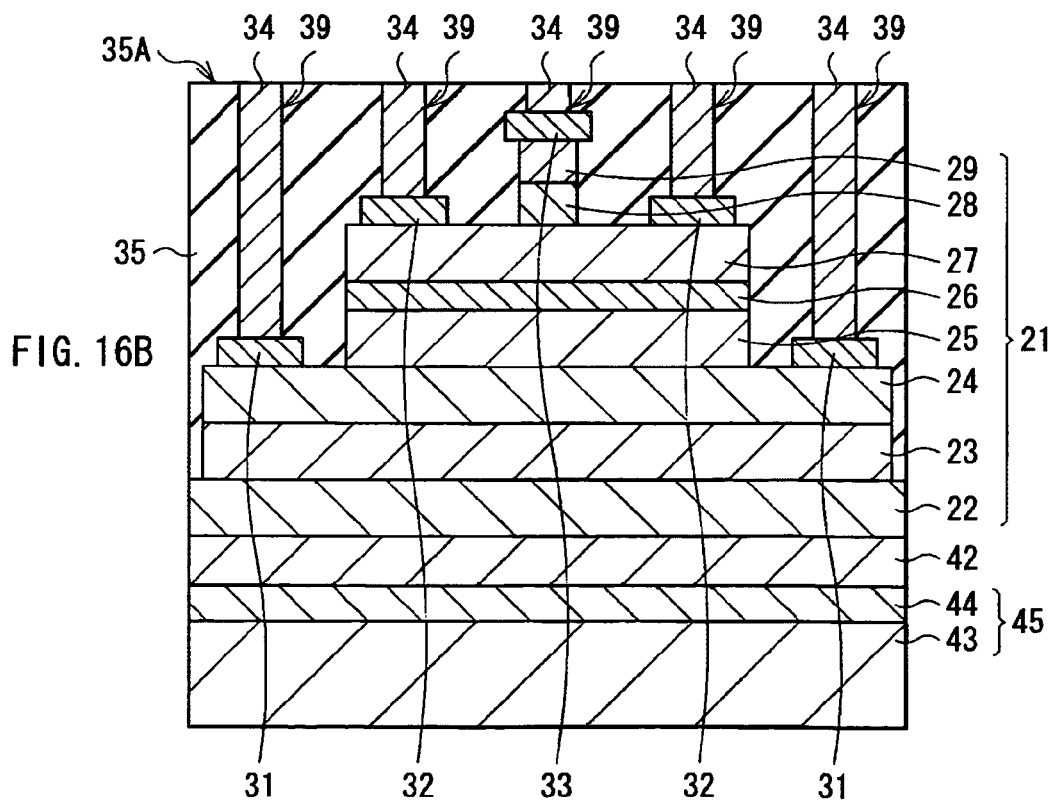

METHOD OF MANUFACTURING SEMICONDUCTOR DEVICE

BACKGROUND OF THE INVENTION

1. Field of the Invention

The present invention relates to a method of manufacturing a semiconductor device including an indium phosphide (InP)-based device layer.

2. Description of the Related Art

Electronic devices such as high electron mobility transistor (HEMTs) and heterojunction bipolar transistors (HBTs) formed on InP substrates, and light-emitting/receiving devices such as light emitting diodes (LEDs), laser diode (LDs) and photo diodes (PDs) formed on InP substrates are expected as next-generation high-performance key devices for wireless and optical communications.

However, one of major issues to be solved to achieve the devices is the high cost of InP substrates. Compared to gallium arsenide (GaAs) substrates, the cost of materials of the InP substrates are high, and it is difficult to form the InP substrates, so the InP substrates are 3 to 10 times more expensive than the gallium arsenide substrates. Moreover, at present, a demand for larger-diameter InP substrates is poor, so substrates with a diameter of 150 mm (6 inches) have not yet commercialized. Therefore, there is an issue that compared to the case where the devices are formed on 150-mm diameter GaAs substrates, substrate cost makes up a large proportion of chip cost.

To solve the issue, there is proposed a metamorphic technique using low-cost large-diameter GaAs substrates. In this technique, it is necessary to grow a metamorphic buffer layer which confines defects caused by a lattice mismatch on a GaAs substrate.

However, in the case where an attempt to achieve lower defect density is made to enhance the performance of the device, the thickness of the metamorphic buffer layer is increased, and in some cases, the thickness of the metamorphic buffer layer becomes a few μm or over. The increased thickness of the metamorphic buffer layer may cause not only an increase in cost of crystal growth but also current leakages or stray capacity. In particular, in the case where the metamorphic technique is attempted to be applied to a bipolar device which is more susceptible to defects or heat generation than a unipolar device, the above-described issue constitutes a big barrier to commercialization. Therefore, a technique for forming the device on the InP substrate at low cost is necessary.

On the other hand, to reduce the cost of the device formed on the GaAs substrate, an epitaxial liftoff (ELO) technique which uses an aluminum arsenide (AlAs) layer as a sacrificial layer has been studied. In the ELO technique, a substrate and a device layer formed by epitaxial growth are separated from each other, and the substrate is reused, thereby substrate cost may be remarkably reduced. An example in which an AlAs layer is used for the device on the InP substrate has been also reported.

However, the generation of high-density defects caused by a lattice mismatch between the InP substrate and the AlAs layer causes deterioration of electrical characteristics, so a practical device has not yet been achieved.

Moreover, as described in, for example, Japanese Unexamined Patent Application Publication No. S61-110470, it has been reported that in an InP homostructure solar cell, at least one kind selected from the group consisting of indium gallium arsenide (InGaAs), indium aluminum arsenide (InAlAs), indium gallium aluminum arsenide (InGaAlAs), indium aluminum arsenide phosphide (InAlAsP) and indium gallium arsenide phosphide (InGaAsP) is used as a sacrificial layer.

SUMMARY OF THE INVENTION

In a device having a heterojunction, the same material as that of a sacrificial layer is used in the device, so when the sacrificial layer is etched, the device is also etched.

Thus, in the techniques in related arts, it is difficult to achieve an InP-based semiconductor device at low cost without deteriorating device characteristics.

It is desirable to provide a method of manufacturing a semiconductor device capable of being achieved at low cost without deteriorating device characteristics.

According to an embodiment of the invention, there is provided a first method of manufacturing a semiconductor device including the following two steps (A1) and (A2):

(A1) a formation step of forming a sacrificial layer which is pseudomorphic to InP on an InP substrate, and then forming an InP-based device layer on the sacrificial layer; and (A2) a separation step of separating the InP substrate and the device layer from each other by etching the sacrificial layer.

Herein, "pseudomorphic" indicates that the sacrificial layer has a crystal structure in which the lattice constant in a laminate in-plane direction of the sacrificial layer is equal to the lattice constant in a laminate in-plane direction of InP, and the lattice constant in a laminating direction of the sacrificial layer is different from the lattice constant in a laminating direction of InP. However, in the embodiment of the invention, "pseudomorphic" includes not only an ideal state in which a lattice mismatch is not present but also a state in which a minor lattice defect which does not adversely affect device characteristics is present.

According to an embodiment of the invention, there is provided a second method of manufacturing a semiconductor device including the following two steps (B1) and (B2):

(B1) a forming step of forming a sacrificial layer which pseudomorphic to InP on a metamorphic buffer layer of a metamorphic substrate, and then forming an InP-based device layer on the sacrificial layer, the metamorphic substrate including a GaAs substrate and the metamorphic buffer layer formed on a surface of the GaAs substrate, the metamorphic buffer layer having a smaller lattice mismatch to InP than a lattice mismatch between GaAs and InP; and (B2) a separation step of separating the metamorphic substrate and the device layer from each other by etching the sacrificial layer.

In the first and second methods of manufacturing a semiconductor device according to the embodiment of the invention, the sacrificial layer which is pseudomorphic to InP is etched to separate the InP substrate or the metamorphic substrate and the InP-based device layer from each other. Herein, a material which is pseudomorphic to InP is used as the sacrificial layer, so compared to the case where an AlAs single layer is used as the sacrificial layer, the defect density of the device layer is reduced. Moreover, while preventing an increase in the defect density of the device layer, the sacrificial layer has a larger thickness than that in the case where the AlAs single layer is used as the sacrificial layer, so the sacrificial layer is etched at a practical etching rate (for example, $10^{-2}$ nm/h or over) through the use of a predetermined etchant. Further, in the case where such an etchant is used, the etching rate of the InP-based device layer relative to the etchant is sufficiently reduced. In other words, the InP-based device layer has etching resistance to such an etchant.

Herein, the sacrificial layer which is pseudomorphic to InP may include an InAlAs layer including at least In, Al and As. Moreover, in the case where the device layer includes a plurality of semiconductor layers, the In composition ratio of the InAlAs layer in the sacrificial layer may be lower than the In composition ratio of a layer including In out of the plurality of semiconductor layers in the device layer. Further, as the InP-based device layer, a semiconductor layer having a sufficiently small etching rate relative to an etchant capable of etching the sacrificial layer which is pseudomorphic to InP at a practical etching rate (for example, $10^{-2}$ mm/h or over), for example, an InP layer, an InAlAs layer, an InGaAs layer or an InGaAlAs layer which is lattice-matched to InP may be used.

In the first and second methods of manufacturing a semiconductor device according to the embodiment of the invention, the sacrificial layer which is pseudomorphic to InP is etched to separate the InP substrate or the metamorphic substrate and the InP-based device layer from each other, so compared to the case where the AlAs single layer is used as the sacrificial layer, the defect density of the device layer may be reduced, and better device characteristics than those in the case where the AlAs single layer is used as the sacrificial layer may be obtained. Moreover, when the sacrificial layer is stripped off, the sacrificial layer may be etched at a more practical etching rate than that in the case where the AlAs single layer is used as the sacrificial layer, and the possibility that the device layer is etched together with the sacrificial layer during etching of the sacrificial layer may be prevented. Thereby, the semiconductor device may be achieved at low cost without deteriorating the device characteristics.

Other and further objects, features and advantages of the invention will appear more fully from the following description.

BRIEF DESCRIPTION OF THE DRAWINGS

FIGS. 16A and 16B are sectional views for describing steps following the steps of FIGS. 15A and 15B.

DETAILED DESCRIPTION OF THE PREFERRED EMBODIMENTS

A preferred embodiment will be described in detail below referring to the accompanying drawings.

Figure 1:
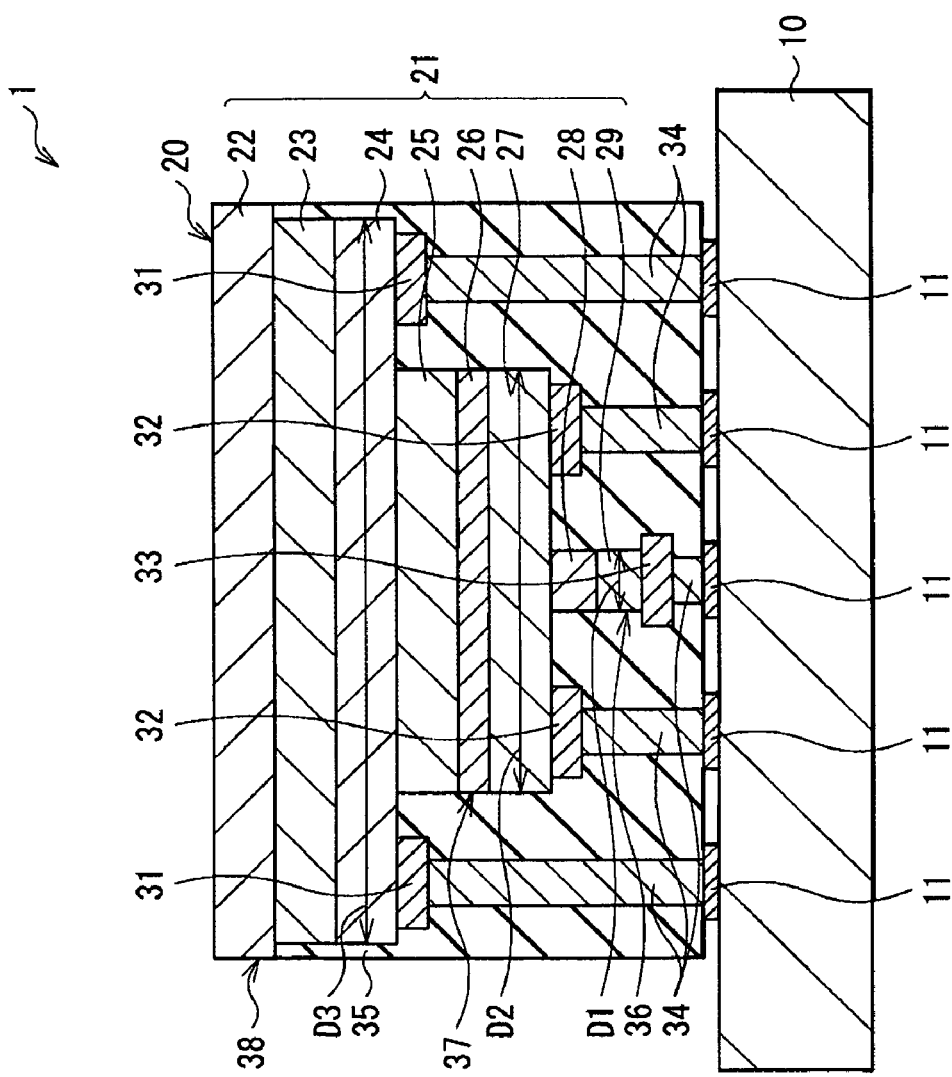
FIG. 1 is a sectional view of a semiconductor device according to an embodiment of the invention.

FIG. 1 illustrates an example of a sectional configuration of a semiconductor device 1 formed by a method of manufacturing a semiconductor device according to an embodiment of the invention. The semiconductor device 1 is an InP-based double-heterojunction bipolar transistor (DHBT) which is suitably applicable to a high-power device such as a power amplifier. As illustrated in FIG. 1, for example, in the semiconductor device 1, a chip 20 is fixed on a supporting substrate 10.

The supporting substrate 10 includes a plurality of electrodes 11 on a surface on the chip 20 side, and each of the electrodes 11 is connected to each of extraction electrodes 34 (which will be described later) of the chip 20. The supporting substrate 10 is, for example, a semiconductor substrate or an insulating substrate. Examples of the semiconductor substrate include a silicon substrate which is easily available as a low-cost large-diameter substrate. Examples of the insulating substrate include an AlN substrate, a sapphire substrate, a ceramic substrate and the like. In particular, the AlN substrate has a thermal expansion coefficient close to the thermal expansion coefficient of GaAs or InP, so a stress to the chip 20 caused by bonding is small. Moreover, the AlN substrate has high thermal conductivity and high heat radiation. Therefore, the AlN substrate is preferably used as the supporting substrate 10. As the ceramic substrate, a low-temperature co-fired ceramic (LTCC) substrate is preferably used. The electrodes 11 are made of, for example, a metal, an electrically conductive resin or the like.

The chip 20 includes a device layer 21 formed by laminating a sub-collector layer 22, a collector layer 23, an intermediate layer 24, an intermediate layer 25, a grated layer 26, a base layer 27, an emitter layer 28 and a contact layer 29 in order from a surface on an opposite side from the supporting substrate 10 of the chip 20.

In the device layer 21, the emitter layer 28 and the contact layer 29 form an emitter mesa 36 with a width D1, and a region around the emitter mesa 36 in a surface on the emitter layer 28 side of the base layer 27 is exposed from the laminate configuration of the device layer 21. The intermediate layer 25, the grated layer 26 and the base layer 27 form a base mesa 37 with a width D2 (>D1), and a region around the base mesa 37 in a surface on the base layer 27 side of the intermediate layer 24 is exposed to the laminate configuration of the device layer 21. Moreover, the collector layer 23 and the intermediate layer 24 form a collector mesa 38 with a width D3(>D2), and a region around the collector mesa 38 in a surface on the collector layer 23 side of the sub-collector layer 22 is exposed to the laminate configuration of the device layer 21. Therefore, the device layer 21 has a stepwise shape in which the width is intermittently reduced from the sub-collector layer 22 side toward the contact layer 29, and each layer of the device layer 21 except for the sub-collector layer 22 is covered with an insulating film 35.

Moreover, an emitter electrode 33 in contact with the contact layer 29 is arranged on a surface on the supporting substrate 10 side of the emitter mesa 36, and a base electrode 32 in contact with the base layer 27 is arranged on a surface on the supporting substrate 10 side of the base mesa 37, and a collector electrode 31 in contact with the intermediate layer 24 is arranged on a surface on the supporting substrate 10 side of the collector mesa 38. Columnar extraction electrodes 34 reaching a surface on the supporting substrate 10 side of the chip 20 are arranged on surfaces on the supporting substrate 10 side of the emitter electrode 33, the base electrode 32 and collector electrode 31, and each of the extraction electrodes 34 is bonded or adhered to each of the electrodes 11 of the supporting substrate 10.

The device layer 21 has a double heterostructure in which each of the band gaps of the collector layer 23 and the emitter layer 28 is larger than the band gap of the base layer 27. Moreover, the device layer 21 is made of an InP-based Group III-V compound semiconductor. Herein, the InP-based Group III-V compound semiconductor indicates InP or a Group III-V compound semiconductor which is perfectly or approximately lattice-matched to InP. Examples of the Group III-V compound semiconductor which is perfectly or approximately lattice-matched to InP include $In_{0.53}Ga_{0.47}As$, $In_{0.52}Ga_{0.48}As$, $In_{0.52}Al_{0.48}As$ and the like. Moreover, the InP-based Group III-V compound semiconductor includes a Group III-V compound semiconductor which is pseudomorphic to InP. Herein, "pseudomorphic" indicates that each semiconductor layer included in the device layer 21 has a crystal structure in which the lattice constant in a laminate in-plane direction of each semiconductor layer included in the device layer 21 is equal to the lattice constant in a laminate in-plane direction of InP, and the lattice constant in a laminating direction of each semiconductor layer included in the device layer 21 is different from the lattice constant in a laminating direction of InP. However, in the embodiment, "pseudomorphic" includes not only an ideal state in which a lattice mismatch is not present but also a state in which a minor lattice defect (which will be described later) not adversely affecting device characteristics is present. Examples of the Group III-V compound semiconductor which is pseudomorphic to InP and is used in the device layer 21 include InGaAs, InGaAlAs, InGaAsP, InGaAlAsP and the like.

The sub-collector layer 22 is made of, for example, undoped $In_{0.53}Ga_{0.47}As$. The collector layer 23 is made of, for example, n-type InP. The intermediate layer 24 is made of, for example, n-type $In_{0.53}Ga_{0.47}As$. The intermediate layer 25 is made of, for example, n-type InP. The base layer 27 is made of, for example, p-type $In_{0.53}Ga_{0.47}As$. The emitter layer 28 is made of, for example, n-type InP or n-type $In_{0.53}Al_{0.47}As$. The contact layer 29 is made of, for example, n-type $In_{0.52}Al_{0.48}As$.

The semiconductor device 1 with such a configuration may be manufactured by the following steps, for example. The case where the InP-based Group III-V compound semiconductor is epitaxially grown on an InP substrate with a sacrificial layer in between, and then the semiconductor device 1 is formed through the use of an ELO technique will be described below.

FIGS. 2A and 2B to 5A and 5B illustrate an example of the method of manufacturing the semiconductor device in step sequence.

The InP-based Group III-V compound semiconductor on the InP substrate is formed by, for example, a crystal growth method such as an MOCVD (Metal Organic Chemical Vapor Deposition) method or an MBE (Molecular Beam Epitaxy) method. At this time, as the material of the InP-based Group III-V compound semiconductor, for example, trimethylaluminium (TMAl), trimethylgallium (TMGa), trimethylindium (TMIn), arsine ($AsH_3$) or phosphine ($PH_3$) is used, and as the material of an donor impurity, for example, $H_2Se$ is used, and as the material of an acceptor impurity, for example, dimethylzine (DMZ) is used.

Figure 2A:
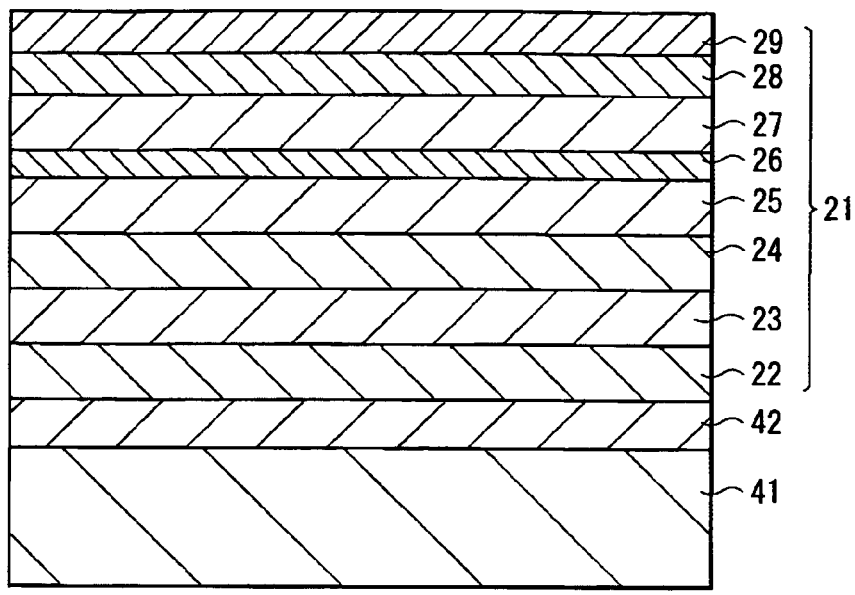
FIGS. 2A and 2B are sectional views for describing an example of a method of manufacturing the semiconductor device illustrated in FIG. 1.

First, as illustrated in FIG. 2A, a sacrificial layer (a layer to be etched) 42 is formed on a surface of an InP substrate 41, and then the device layer 21 formed by laminating the sub-collector layer 22, the collector layer 23, the intermediate layer 24, the intermediate layer 25, the grated layer 26, the base layer 27, the emitter layer 28 and the contact layer 29 in order from the sacrificial layer 42 side is formed on a surface of the sacrificial layer 42.

The sacrificial layer 42 is made of InAlAs which is pseudomorphic to InP, for example, $In_aAl_{1-a}As$ ($0 < a \leq 0.2$, preferably $0.1 \leq a \leq 0.2$ (which will be described later)). Herein, "pseudomorphic" indicates that InAlAs has a crystal structure in which the lattice constant in a laminate in-plane direction of InAlAs is equal to the lattice constant in a laminate in-plane direction of InP, and the lattice constant in a laminating direction of InAlAs is different from the lattice constant in a laminating direction of InP. Also in this case, "pseudomorphic" includes not only an ideal state in which a lattice defect is not present but also a state in which a minor lattice defect (which will be described later) not adversely affecting device characteristics is present. The In composition ratio of the sacrificial layer 42 is preferably lower than the In composition ratio of a layer including In out of the semiconductor layers included in the device layer 21.

The composition ratio in the sacrificial layer 42 may be uniform throughout the sacrificial layer 42, or may be continuously or stepwisely changed from the InP substrate 41 side. For example, in the case where the sacrificial layer 42 is formed of $In_aAl_{1-a}As$, the In composition ratio of the sacrificial layer 42 may be continuously or stepwisely increased from the InP substrate 41 side. Moreover, the whole sacrificial layer 42 may be formed of an InAlAs single layer which is pseudomorphic to InP, or may be formed of a laminate configuration including an InAlAs layer which is pseudomorphic to InP and an AlAs layer. For example, in the sacrificial layer 42, a surface layer on the InP substrate 41 side (an opposite side from the device layer 21) is formed of the AlAs layer, and a surface layer on the device layer 21 side is formed of the InAlAs layer which is pseudomorphic to InP.

Figure 2B:
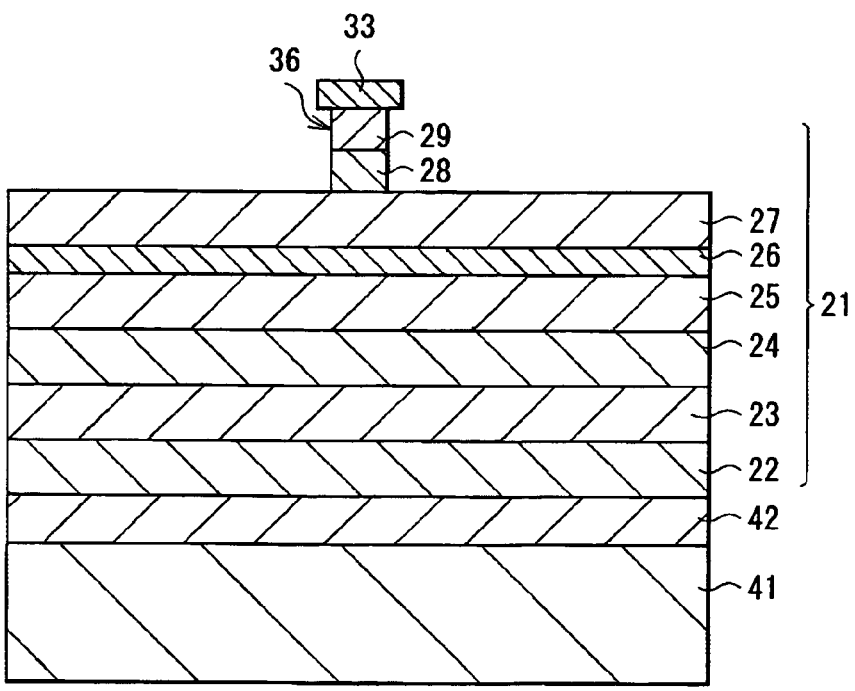

Next, as illustrated in FIG. 2B, the emitter electrode 33 is formed on a surface of the device layer 21 (the contact layer 29), and then the emitter layer 28 and the contact layer 29 are selectively etched through the use of the emitter electrode 33 as a mask to form the emitter mesa 36.

Figure 3A:
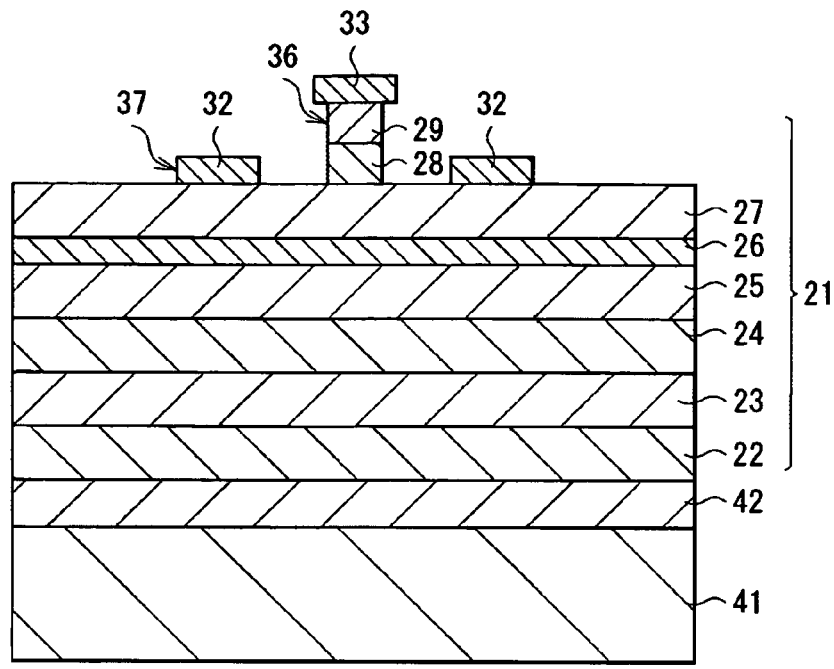
FIGS. 3A and 3B are sectional views for describing steps following steps of FIGS. 2A and 2B.
Figure 3B:
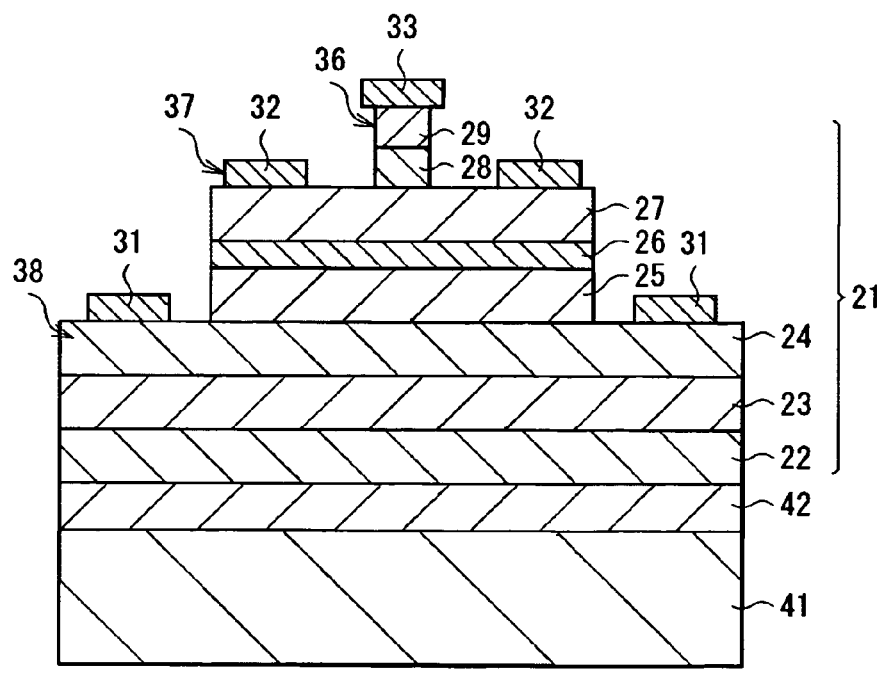

Next, as illustrated in FIG. 3A, the base electrode 32 is formed around the emitter mesa 36. Then, as illustrated in FIG. 3B, a predetermined region including the emitter electrode 33 and the base electrode 32 is covered with a protective film (not illustrated), and then the intermediate layer 25, the grated layer 26 and the base layer 27 are selectively etched to form the base mesa 37. Then, the collector electrode 31 is formed around the base mesa 37.

Figure 4A:
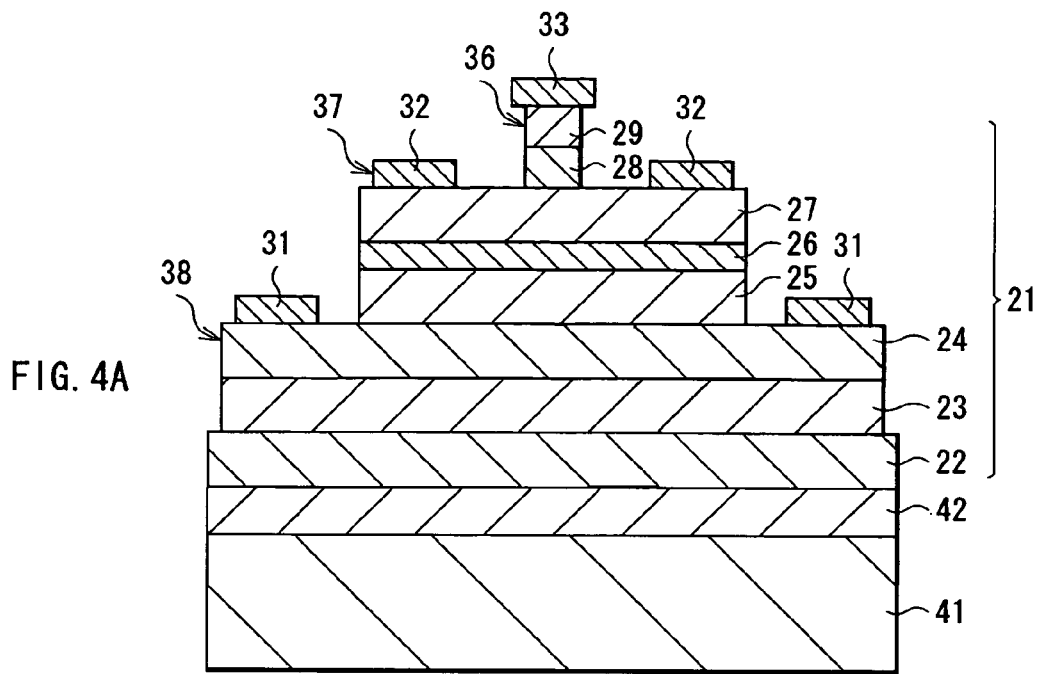
FIGS. 4A and 4B are sectional views for describing steps following the steps of FIGS. 3A and 3B.

Next, as illustrated in FIG. 4A, a predetermined region including the emitter electrode 33, the base electrode 32 and the collector electrode 31 is covered with a protective film (not illustrated), and then the collector layer 23 and the intermediate layer 24 are selectively etched to form the collector mesa 38.

Figure 4B:
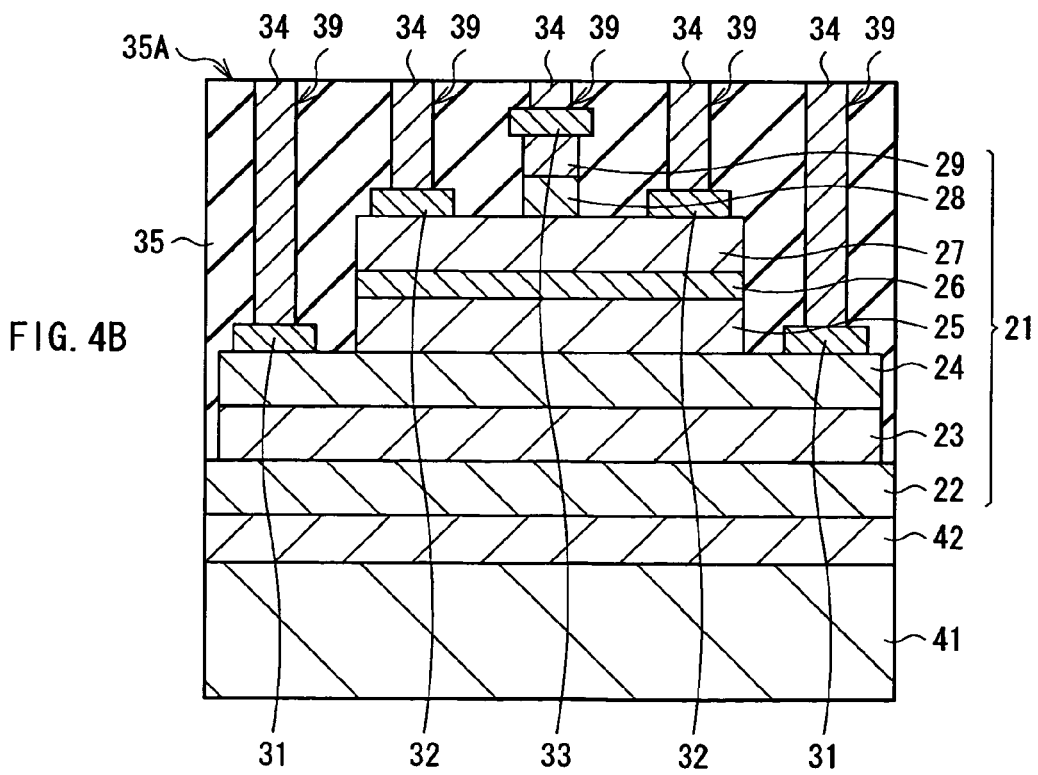

Next, as illustrated in FIG. 4B, the protective film 35 is formed throughout the surfaces so that the device layer 21, the emitter electrode 33, the base electrode 32 and the collector electrode 31 are buried in the protective film 35, and a flat surface 35A is formed on a top surface of the protective film 35. The above-described protective film 35 is provided to prevent the device layer 21 from being etched with the sacrificial layer 42 when etching the sacrificial layer 42 in a later step. Next, holes 39 are formed in portions above the emitter electrode 33, the base electrode 32 and the collector electrode 31 of the protective film 35, and then the extraction electrode 34 is formed in each of the holes 39.

Figure 5A:
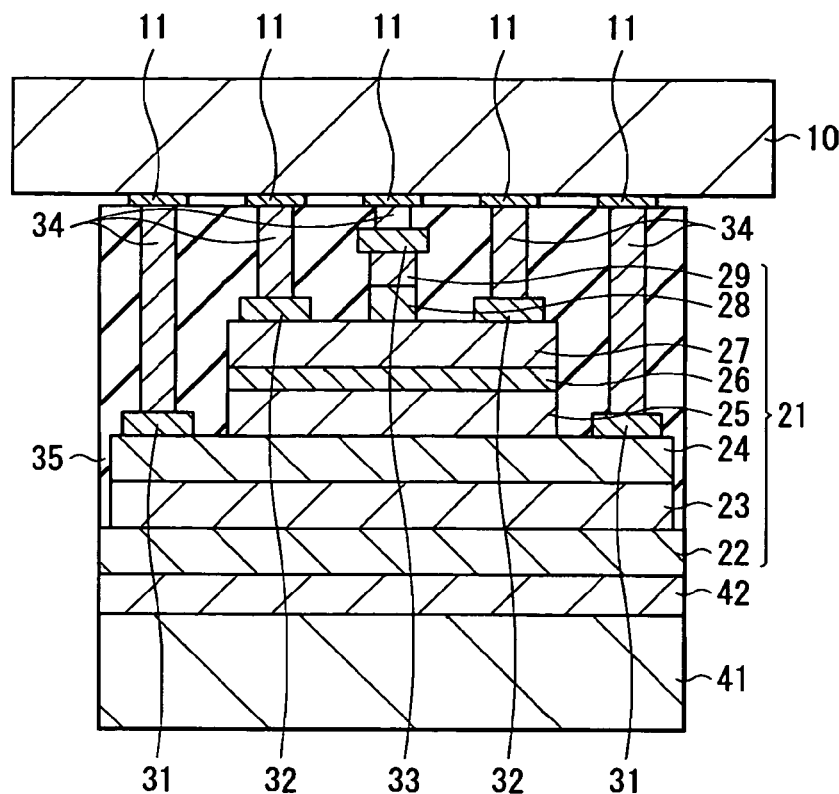
FIGS. 5A and 5B are sectional views for describing steps following the steps of FIGS. 4A and 4B.

Next, as illustrated in FIG. 5A, the supporting substrate 10 is bonded or adhered to the flat surface 35A of the protective film 35. At this time, the device layer 21 is fixed to the supporting substrate 10 by bonding the extraction electrodes 34 and the electrodes 11 to each other. Next, as illustrated in FIG. 5B, the sacrificial layer 42 is selectively etched so as to separate the InP substrate 41 and the supporting substrate 10 including the device layer 21 from each other.

In this case, when the sacrificial layer 42 is selectively etched, for example, wet etching is used. As an etchant capable of selectively etching the sacrificial layer 42 relative to the InP substrate 41 and the device layer 21 (the sub-collector layer 22), for example, a hydrofluoric acid may be used. The hydrofluoric acid has a high etching rate relative to InAlAs which is pseudomorphic to InP, and an extremely low etching rate relative to InP, or InAlAs, InGaAs, InGaAlAs and InGaAsP which are lattice-matched to InP, so InAlAs which is pseudomorphic to InP may has sufficient etching selectivity relative to InAlAs, InGaAs, InGaAlAs and InGaAsP which are lattice-matched to InP when using the hydrofluoric acid as an etchant. In addition, other etchants except for the hydrofluoric acid may be used as long as the etchants are capable of having high etching selectivity between the sacrificial layer 42 and the device layer 21. Moreover, etching may be performed not only by immersing an element in the etchant but also by supplying the etchant in vapor form to the element. Thereby, the sacrificial layer 42 is selectively etched relative to the InP substrate 41 and the device layer 21 (the sub-collector layer 22) to separate the InP substrate 41 and the supporting substrate 10 including the device layer 21 from each other. Thus, the semiconductor device 1 according to the embodiment of the invention is manufactured.

The operation of the semiconductor device 1 according to the embodiment of the invention is basically the same as that of a typical bipolar transistor. In the semiconductor device 1, transistor operation is performed by controlling the amount of electrons flowing from the emitter layer 28 to the collector layer 23 by a base current (a Hall current). In the typical bipolar transistor, when the Hall current is increased, a collector current is increased, and when the Hall is further increased, the Hall is leaked from the base layer 23 to the emitter layer 28, thereby the current amplification factor of the transistor easily declines. However, in the embodiment, a semiconductor material of a different kind with a larger band gap than that of the base layer 27 is used for the emitter layer 28, so a barrier is formed at a base-emitter interface, thereby leakage of the Hall to the emitter layer 28 is prevented. Thereby, the collector current is increased without reducing the current amplification factor. Moreover, in the embodiment, the semiconductor material of a different kind with a larger band gap than that of the base layer 27 is also used for the collector layer 23, so an abrupt increase in electron-hole pairs caused by impact ionization in the collector layer 23 is prevented, thereby the resistance of the element to pressure is increased. Further, in the embodiment, the grated layer 26 of which the band gap is continuously changed is arranged between the base and the collector so as to prevent a spike in a band structure, so high-speed operation and low-voltage operation are achieved.

Figure 5B:
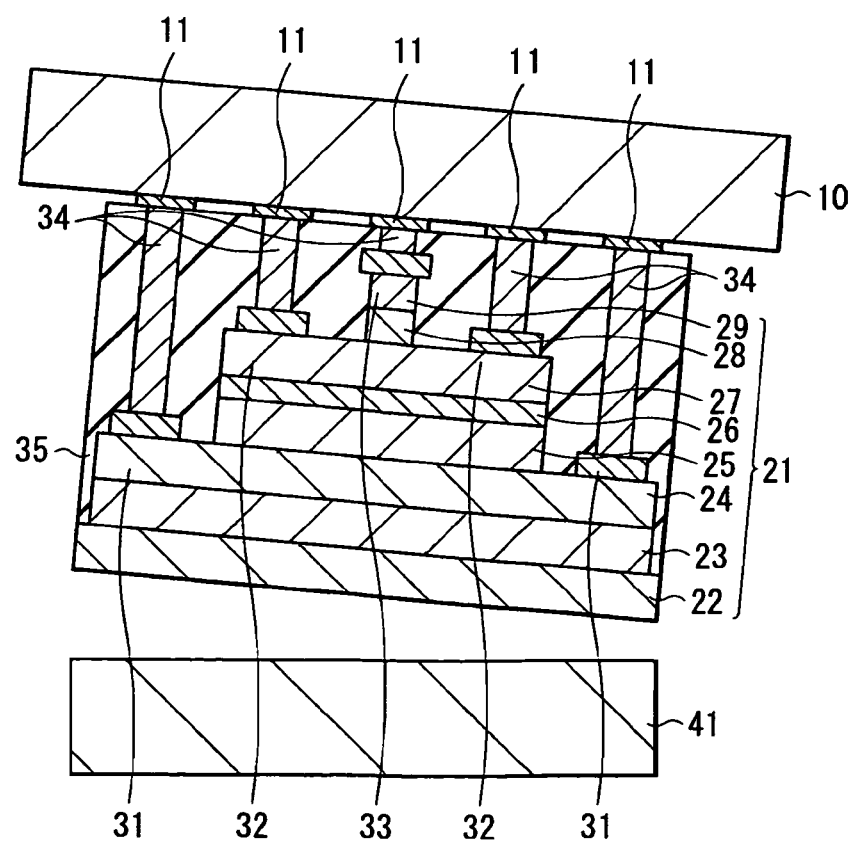

In the method of manufacturing the semiconductor device 1 according to the embodiment, as illustrated in FIG. 5B, the InP substrate 41 is separated from the supporting substrate 10 including the InP-based device layer 21 by selectively etching the sacrificial layer 42 made of InAlAs which is pseudomorphic to InP. Thereby, the InP substrate 41 is reusable, so manufacturing cost is reduced. In this case, as the sacrificial layer 42, InAlAs which is pseudomorphic to InP is used, so compared to the case where an AlAs single layer is used as the sacrificial layer 42, the defect density of the device layer 21 formed on the sacrificial layer 42 is reduced. Thereby, better device characteristics than those in the case where the AlAs single layer is used as the sacrificial layer 42 are obtained. Moreover, while an increase in the defect density of the device layer 21 is prevented, the sacrificial layer 42 has a larger thickness than that in the case where the AlAs single layer is used as the sacrificial layer 42, so the sacrificial layer 21 is etched at a practical etching rate (for example, $10^{-2}$ mm/h or over) by using the above-described etchant (for example, the hydrofluoric acid). On the other hand, the device layer 21 (the sub-collector layer 22) has etching resistance to the above-described etchant (for example, the hydrofluoric acid), so in the case where the above-described etchant (for example, the hydrofluoric acid) is used, the etching rate of the device layer 21 (the sub-collector layer 22) relative to the above-described etchant (for example, the hydrofluoric acid) is sufficiently reduced. Thereby, the possibility that the device layer 21 is etched together with the sacrificial layer 42 when stripping off the sacrificial layer 42 is prevented.

Figure 6:
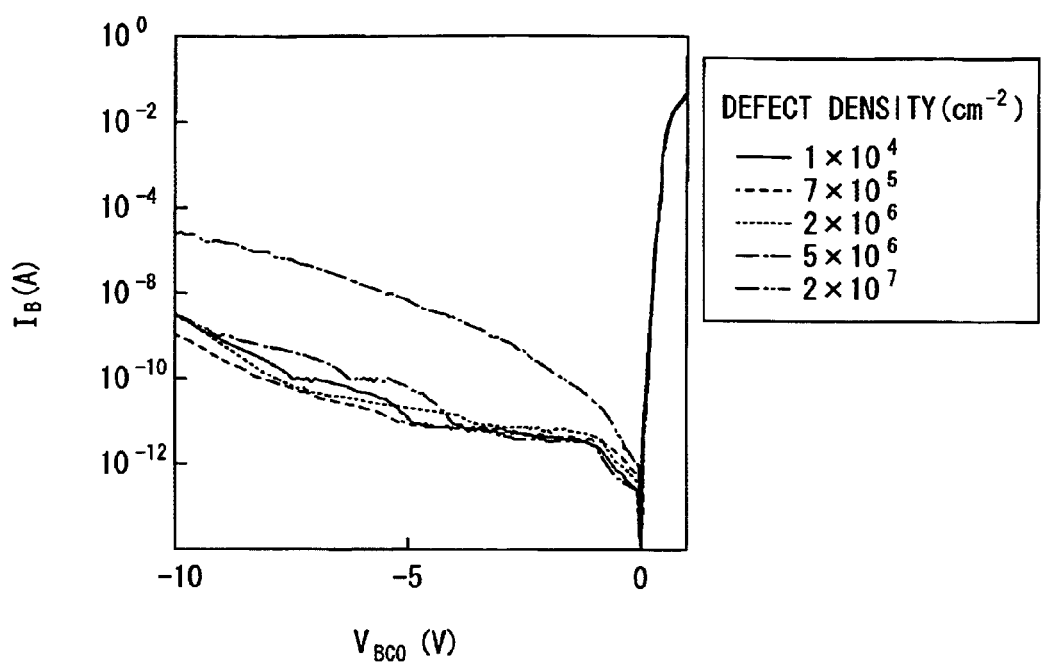
FIG. 6 is a plot illustrating two-terminal characteristics between a base and a collector of the semiconductor device illustrated in FIG. 1.
Figure 7:
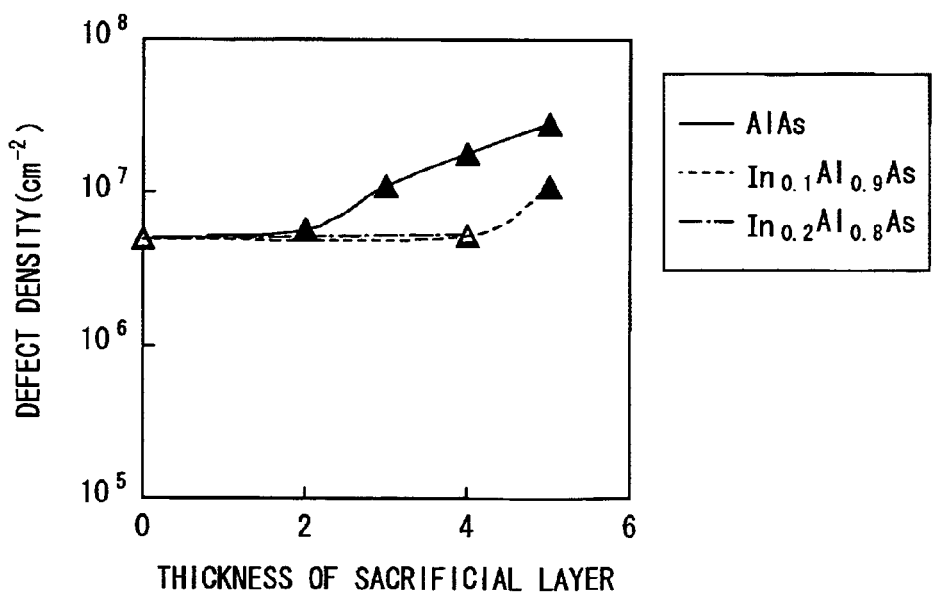
FIG. 7 is a plot illustrating a relationship between the thickness of a sacrificial layer in the semiconductor device illustrated in FIG. 1 and defect density.
Figure 8:
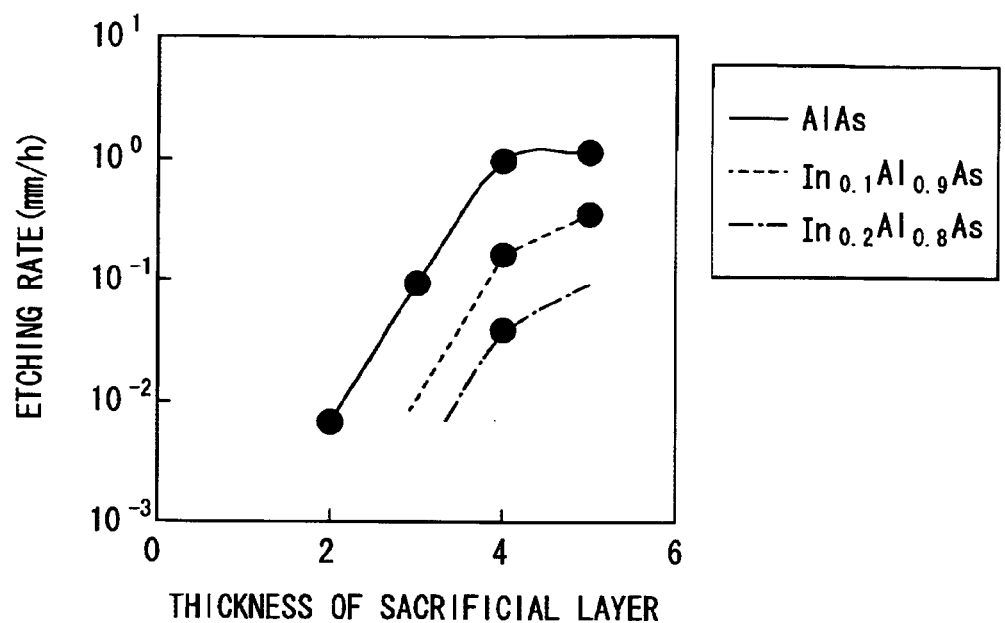
FIG. 8 is a plot illustrating a relationship between the thickness of the sacrificial layer of the semiconductor device illustrated in FIG. 1 and an etching rate.

FIG. 6 illustrates the product of a voltage $V_{BCO}$ between the base and the collector of the semiconductor device 1 manufactured by the above-described manufacturing method and a base current $I_B$. FIG. 6 also illustrates a relationship between a voltage $V_{BCO}$ between a base and a collector of a semiconductor device in which the device layer 21 is formed directly on the surface of the InP substrate 41 and the base current $I_B$ as a comparative example. More specifically, FIG. 6 illustrates results in the cases where the defect density on the collector layer 23 is $7 \times 10^5$ cm$^{-2}$, $2 \times 10^6$ cm$^{-2}$, $5 \times 10^6$ cm$^{-2}$ and $2 \times 10^7$ cm$^{-2}$ in the semiconductor device 1 manufactured by the above-described manufacturing method, and a result in the case where the defect density on the collector layer 23 is $1 \times 10^4$ cm$^{-2}$ in the semiconductor device in which the device layer 21 is formed directly on the surface of the InP substrate 41. FIG. 7 illustrates a relationship between the thickness of the sacrificial layer 42 (made of InAlAs) formed on the surface of the InP substrate 41 and defect density occurring in the sacrificial layer 42. FIG. 8 illustrates a relationship between the thickness of the sacrificial layer 42 and an etching rate when the sacrificial layer 42 is etched with the hydrofluoric acid. FIGS. 7 and 8 illustrate results in the cases where the In composition ratio of the sacrificial layer 42 is 0.1 and 0.2. FIGS. 7 and 8 also illustrate results in the case where the In composition ratio of the sacrificial layer 42 is 0 (that is, the sacrificial layer 42 is made of AlAs) as a comparative example.

It is obvious from FIG. 6 that in the semiconductor device 1 manufactured by the above-described manufacturing method, the device characteristics in the case where the defect density on the collector layer 23 is $5 \times 10^6$ cm$^{-2}$ or less are approximately the same as the device characteristics in the comparative example. In other words, even if a lattice defect of approximately $5 \times 10^6$ cm$^2$ occurs on the collector layer 23, such a level of the defect density is considered as a minor defect density which does not adversely affect the device characteristics. Therefore, it is obvious that when the In composition ratio and the thickness of the sacrificial layer 42 are appropriately adjusted in the above-described manufacturing steps so that the defect density on the collector layer 23 becomes $5 \times 10^6$ cm$^{-2}$ or less, the device characteristics equal to those in the comparative example are obtained.

It is obvious from FIG. 7 that when the In composition ratio of the sacrificial layer 42 is within a range of 0.1 to 0.2 both inclusive, and the thickness of the sacrificial layer 42 is within a range of greater than 0 to 5 nm inclusive, the defect density on the collector layer 23 becomes $1 \times 10^7$ cm$^{-2}$ or less. Moreover, it is obvious that when the thickness of the sacrificial layer 42 is within a range of greater than 0 to 4 nm inclusive, the defect density on the collector layer 23 becomes approximately $5 \times 10^6$ cm$^{-2}$.

It is obvious from FIG. 8 that when the In composition ratio of the sacrificial layer 42 is within a range of 0.1 to 0.2 both inclusive, and the thickness of the sacrificial layer 42 is greater than 3 nm, the etching rate of the sacrificial layer 42 relative to the hydrofluoric acid becomes a practical etching rate (for example, $10^{-2}$ mm/h or over).

Therefore, considering all of the results in FIGS. 6 to 8, it is obvious that when the In composition ratio of the sacrificial layer 42 is within a range of 0.1 to 0.2 both inclusive, and the thickness of the sacrificial layer 42 is within a range of greater than 3 nm to 5 nm inclusive, the defect density on the collector layer 23 becomes $1 \times 10^7$ cm$^{-2}$ or less, and the etching rate of the sacrificial layer 42 relative to the hydrofluoric acid becomes a practical etching rate (for example, $10^{-2}$ mm/h or over). Moreover, it is obvious that when the thickness of the sacrificial layer 42 is within a range of greater than 3 nm to 4 nm inclusive, the defect density on the collector layer 23 is reduced to a minor level which does not adversely affect the device characteristics.

Thus, in the method of manufacturing the semiconductor device 1 according to the embodiment, when the InP-based device layer 21 is formed on the InP substrate 41 with the sacrificial layer 42 in between, better device characteristics than those in the case where the AlAs single layer is used as the sacrificial layer 42 are obtained, and when the ELO technique for stripping off the sacrificial layer 42 is used, the sacrificial layer 42 is etched at a more practical etching rate than that in the case where the AlAs single layer is used as the sacrificial layer 42, and the possibility that the device layer 21 is etched together with the sacrificial layer 42 is prevented.

Moreover, in the embodiment, the InP substrate 41 and the device layer 21 are separated from each other through the use of the ELO technique for selectively removing the sacrificial layer 42, so compared to the case where the device layer 21 is formed directly on the InP substrate 41, and then the InP substrate 41 is removed by polishing, wet etching or the like, a portion on the InP substrate 41 side of the device layer 21 is easily processed. Thereby, another device configuration may be easily formed in the portion on the InP substrate 41 side of the device layer 21, so the device characteristics may be further improved by a simple process.

Thus, in the embodiment, the semiconductor device 1 is achieved at low cost without deteriorating the device characteristics.

In addition, for example, as described in IEEE ELECTRON DEVICE LETTERS, VOL. 13, NO. 10, OCTOBER 1992, it is known that InAlAs is used as an etching stop layer. Moreover, InAlAs is a material commonly used in an InP-based device, and when the InAlAs is used in the InP-based device, the In composition ratio of the InAlAs is generally set to a value in a range (typically 0.50 to 0.56) in which InAlAs is perfectly or approximately lattice-matched to InP or pseudomorphic to InP. In other words, the composition ratio of InAlAs is not set to a value out of the above-described range (typically 0.50 to 0.56). Therefore, in the field of the InP-based devices, InAlAs is considered as one of materials which do not have resistance to etchants such as the hydrofluoric acid. On the other hand, in the embodiment, the composition ratio of InAlAs used in the sacrificial layer 42 is a value in a range (for example, in a range of greater than 0 to 0.2 inclusive) in which InAlAs is pseudomorphic to InP, and is a value largely deviating from the range commonly used in the InP-based devices. The composition ratio of InAlAs is set to a value largely deviating from the range commonly used in the InP-based devices, because it is noted that the etching rate of InAlAs relative to the hydrofluoric acid is pronouncedly changed depending on the In composition ratio of InAlAs. In other words, it is because it is found out that when the In composition ratio of InAlAs is appropriately set, InAlAs is usable as not an etching stop layer but an etching layer. Therefore, setting the In composition ratio of InAlAs to a value deviating from the range commonly used in the InP-based devices without noting such a point is not considered inevitable in the field of this technology. Therefore, using InAlAs which is pseudomorphic to InP as the sacrificial layer 42 used for stripping off the InP-based device layer 21 is considered extremely novel in the field of the InP-based devices.

First Modification

In the above-described embodiment, the case where the method of manufacturing the semiconductor device according to the embodiment of the invention is applied to a method of manufacturing a DHBT is described; however, the method of manufacturing the semiconductor device according to the embodiment of the invention is applicable to other devices, for example, a SHBT, a HEMT, an LED, an LD, a PD and the like.

Figure 9:
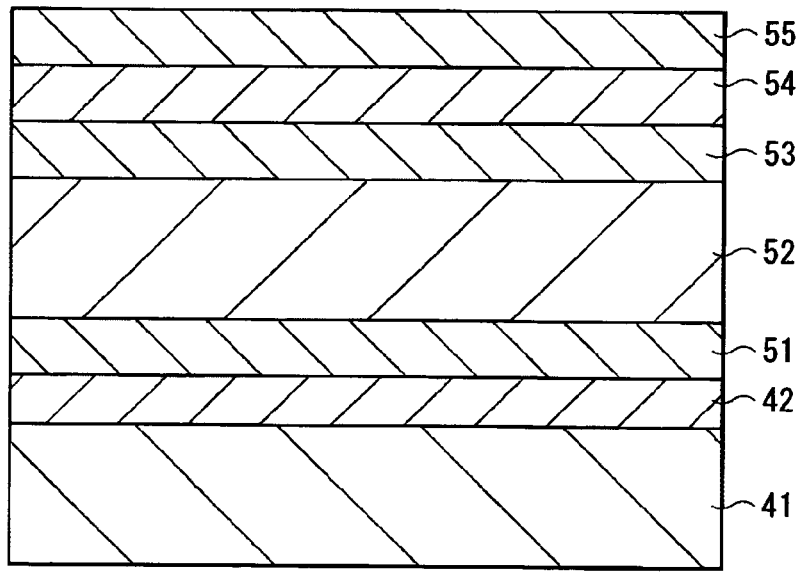
FIG. 9 is a sectional view for describing a method of manufacturing another device.

For example, in the case where the SHBT is manufactured, as illustrated in FIG. 9, first, a protective layer 51 made of InP, a collector layer 52 made of n-type $In_{0.53}Ga_{0.47}As$, a base layer 53 made of p-type $In_{0.53}Ga_{0.47}As$, an emitting layer 54 made of n-type InP or n-type $In_{0.52}Al_{0.48}As$, and a contact layer 55 made of n-type $In_{0.53}Ga_{0.47}As$ are laminated in order from the sacrificial layer 42 side to form an InP-based device layer 56 which is lattice-matched to InP on the surface of the sacrificial layer 42. After that, the SHBT is formed on the device layer 56, and the sacrificial layer 42 which is pseudomorphic to InP is selectively etched through the use of the hydrofluoric acid or the like, thereby the InP substrate 41 is stripped off from the device layer 56 on which the SHBT is formed. Thus, when the method of manufacturing the semiconductor device according to the embodiment of the invention is applied to manufacturing of the SHBT, the same effects as those in the semiconductor device 1 according to the above-described embodiment are obtained.

Figure 10:
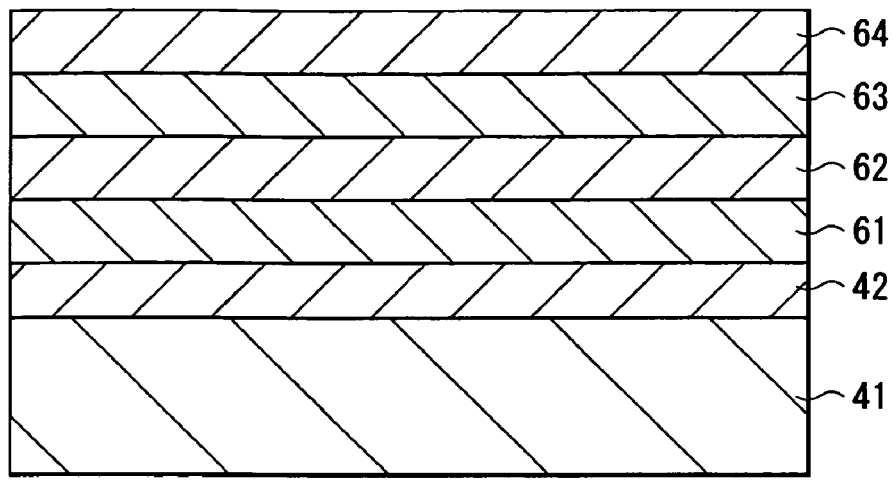
FIG. 10 is a sectional view for describing a method of manufacturing still another device.

Moreover, in the case where the HEMT is manufactured, for example, as illustrated in FIG. 10, a buffer layer 61 made of InP, a channel layer 62 made of $In_{0.53}Ga_{0.47}As$, an electron supply layer 63 made of n-type $In_{0.52}Al_{0.48}As$ and a contact layer 64 made of n-type $In_{0.53}Ga_{0.47}As$ are laminated in order from the sacrificial layer 42 side to form an InP-based device layer 65 which is lattice-matched to InP on the surface of the sacrificial layer 42. After that, the HEMT is formed on the device layer 65, and the sacrificial layer 42 which is pseudomorphic to InP is selectively etched through the use of the hydrofluoric acid or the like, thereby the InP substrate 41 is stripped off from the device layer 65 on which the HEMT is formed. Thus, when the method of manufacturing the semiconductor device according to the embodiment of the invention is applied to manufacturing the HEMT, the same effects as those in the semiconductor device 1 according to the above-described embodiment are obtained.

Figure 11:
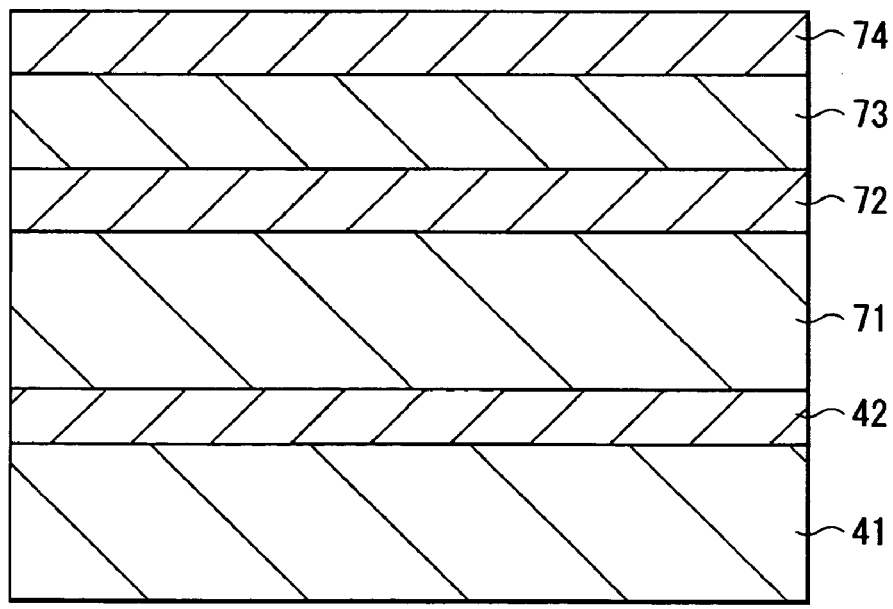
FIG. 11 is a sectional view for describing a method of manufacturing a further device.

In the case where the LED is manufactured, for example, as illustrated in FIG. 11, a first cladding layer 71 made of n-type InP, an active layer 72 made of undoped InGaAsP which is lattice-matched to InP, a second cladding layer 73 made of p-type InP, and a contact layer 74 made of p-type InGaAsP which is lattice-matched to InP are laminated in order from the sacrificial layer 42 side to form an InP-based device layer 75 which is lattice-matched to InP on the surface of the sacrificial layer 42. After that, the LED is formed on the device layer 75, and the sacrificial layer 42 which is pseudomorphic to InP is selectively etched through the use of the hydrofluoric acid or the like, thereby the InP substrate 41 is stripped off from the device layer 75 on which the LED is formed. Thus, when the method of manufacturing the semiconductor device according to the embodiment of the invention is applied to manufacturing of the LED, the same effects as those in the semiconductor device 1 according to the above-described embodiment are obtained.

Figure 12:
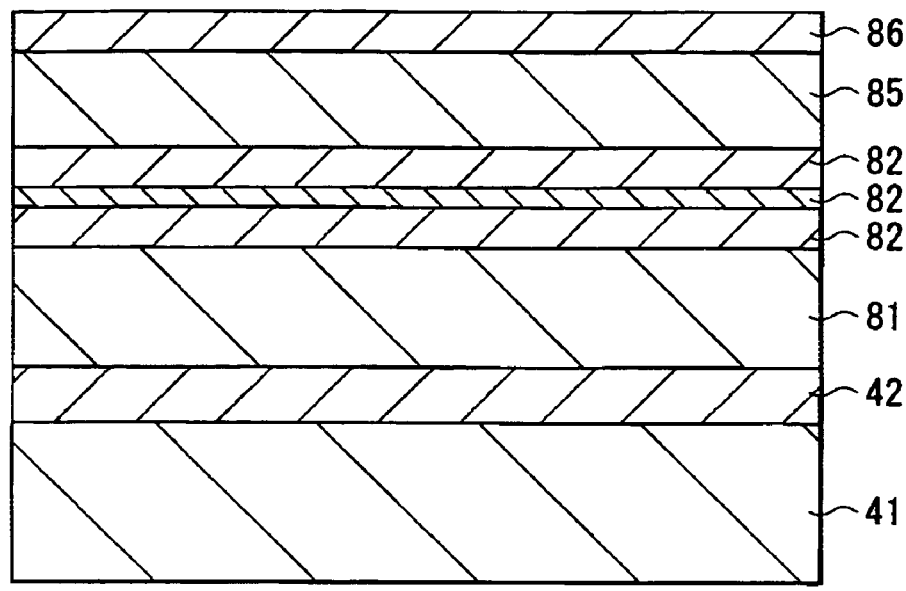
FIG. 12 is a sectional view for describing a method of manufacturing a still further device.

In the case where the LD is manufactured, for example, as illustrated in FIG. 12, a first cladding layer 81 made of n-type InP, a first guide layer 82 made of n-type $In_{0.53}Ga_{0.47}As$, an active layer 83 having an undoped InGaAs/GaAs quantum well structure, a second guide layer 84 made of p-type InGaAlAs which is lattice-matched to InP, a second cladding layer 85 made of p-type InP, and a contact layer 86 made of p-type InP are laminated in order from the sacrificial layer 42 side to form an InP-based device layer 87 which is lattice-matched to InP on the surface of the sacrificial layer 42. After that, the LD is formed on the device layer 87, and the sacrificial layer 42 which is pseudomorphic to InP is selectively etched through the use of the hydrofluoric acid or the like, thereby the InP substrate 41 is stripped off from the device layer 87 on which the LD is formed. Thus, when the method of manufacturing the semiconductor device according to the embodiment of the invention is applied to manufacturing of the LD, the same effects as those in the semiconductor device 1 according to the above-described embodiment are obtained.

Figure 13:
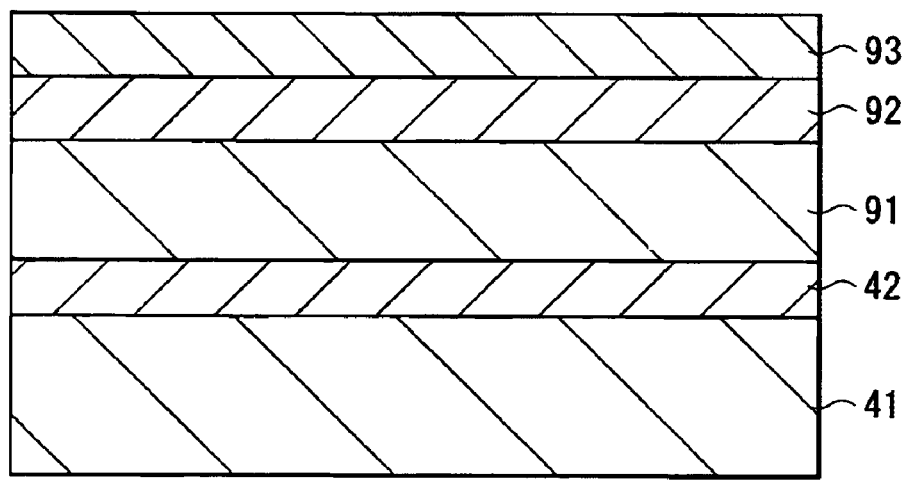
FIG. 13 is a sectional view for describing a method of manufacturing a still device.
Figure 14A:
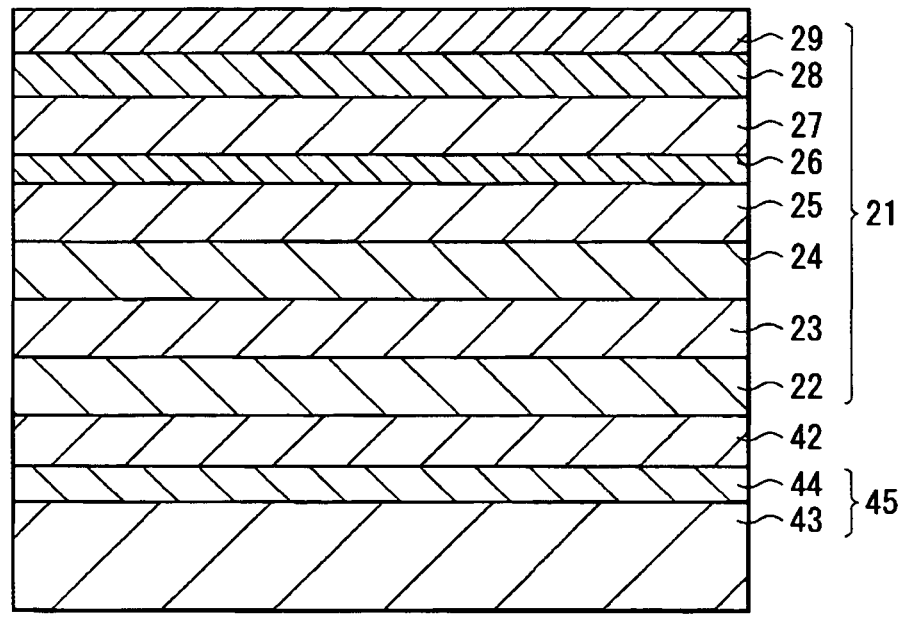
FIGS. 14A and 14B are sectional views for describing another example of the method of manufacturing the semiconductor device illustrated in FIG. 1.
Figure 14B:
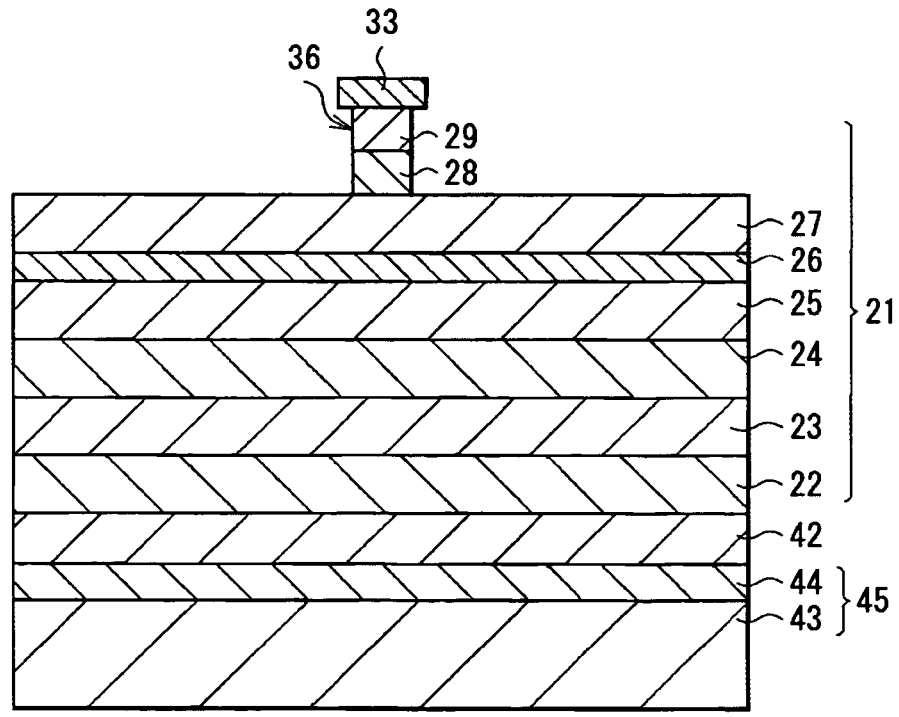
Figure 15A:
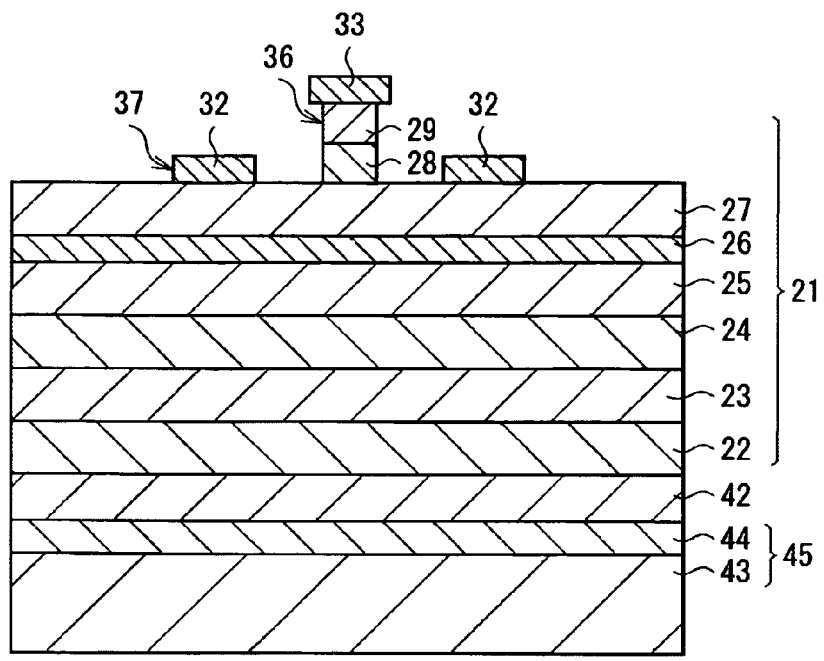
FIGS. 15A and 15B are sectional views for describing steps following steps of FIGS. 14A and 14B.
Figure 15B:
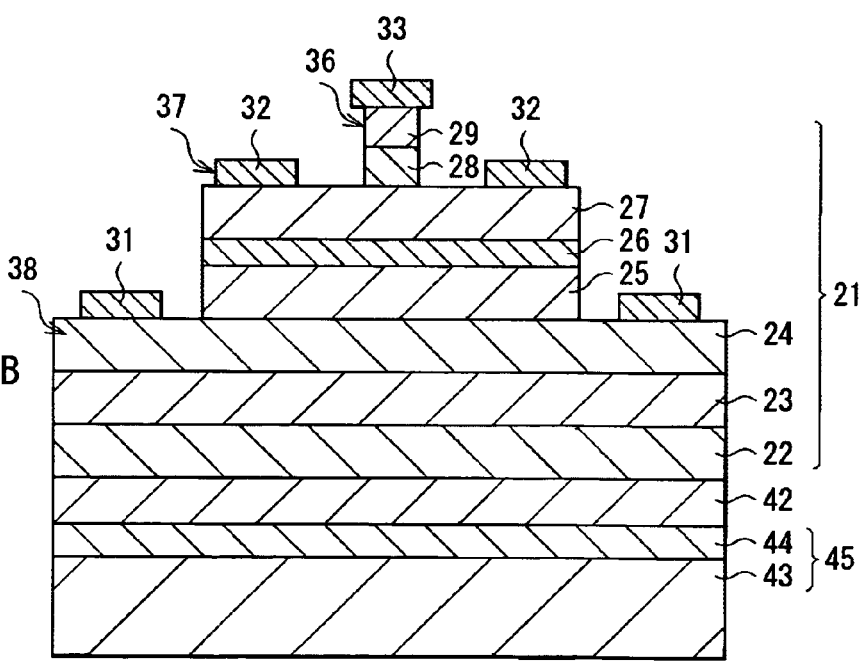
Figure 17A:
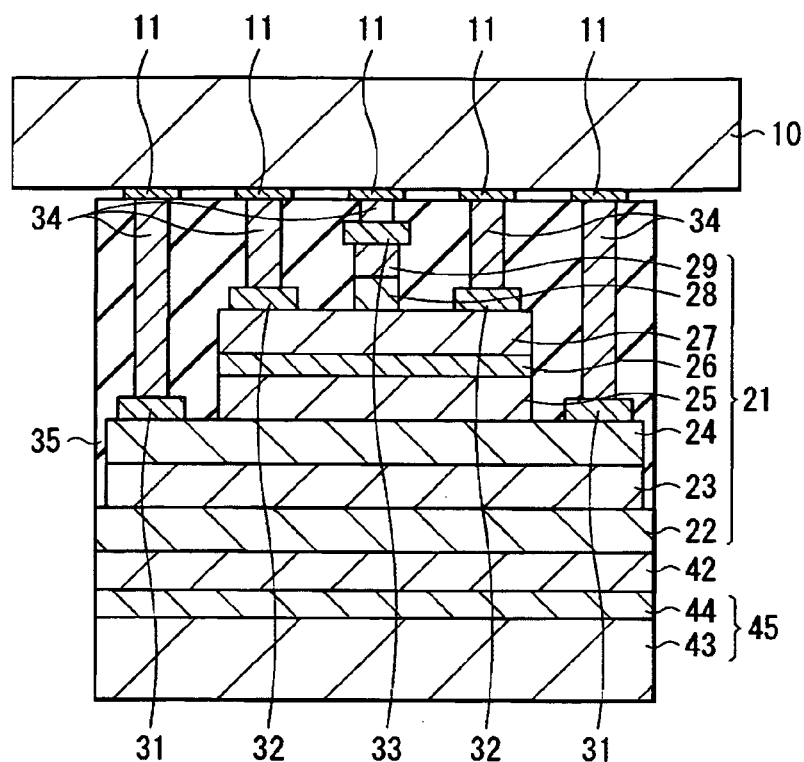
FIGS. 17A and 17B are sectional views for describing steps following the steps of FIGS. 16A and 16B.
Figure 17B:
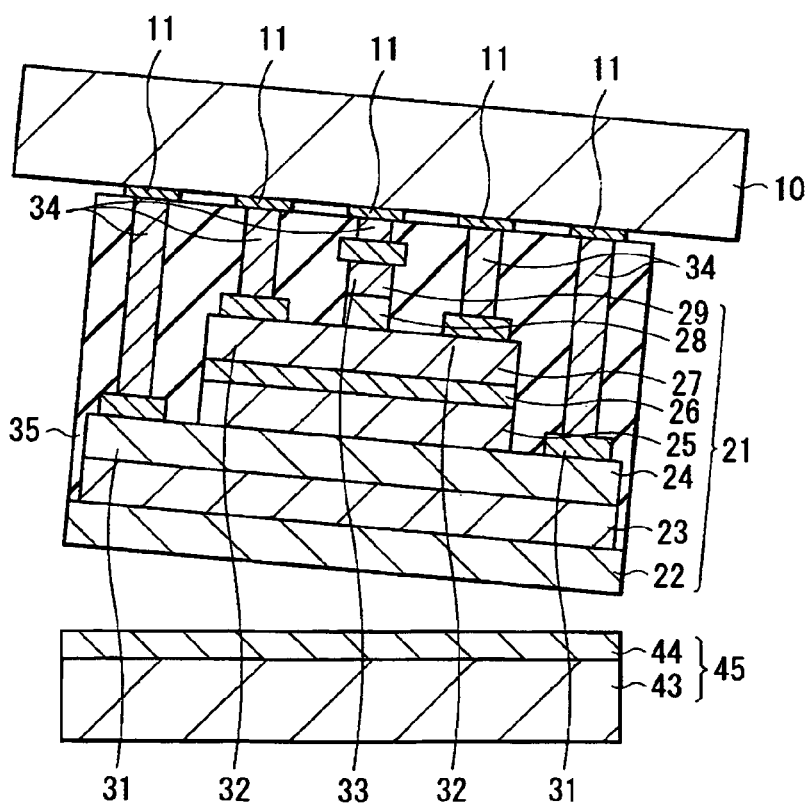

In the case where the PD is manufactured, for example, as illustrated in FIG. 13, a first conductivity type layer 91 made of n-type InP, a light-absorbing layer 92 made of undoped $In_{0.53}Ga_{0.47}As$, and a second conductivity type layer 93 made of p-type $In_{0.53}Ga_{0.47}As$ are laminated in order form the sacrificial layer 42 side to form an InP-based device layer 94 which is lattice-matched to InP on the surface of the sacrificial layer 42. After that, the PD is formed on the device layer 94, and the sacrificial layer 42 which is pseudomorphic to InP is selectively etched through the use of the hydrofluoric acid or the like, thereby the InP substrate 41 is stripped off from the device layer 94 on which the PD is formed. Thus, when the method of manufacturing the semiconductor device is applied to manufacturing of the LD, the same effects as those in the semiconductor device 1 according to the above-described embodiment are obtained.

In the above-described embodiment and the above-described modifications, the InP-based device layer 21, 56, 65, 75, 87 or 94 are epitaxially grown on the InP substrate 41 with the sacrificial layer 42 in between, and then each of various semiconductor devices is formed through the use of the ELO technique for stripping off the sacrificial layer 42. However, for example, as illustrated in FIGS. 14A and 14B to 17A and 17B, in a metamorphic substrate 45, a metamorphic buffer layer 44 having a smaller lattice mismatch to InP than a lattice mismatch between GaAs and InP is formed on a surface of a GaAs substrate 43, and the InP-based device layer 21 may be epitaxially grown on a surface of the metamorphic buffer layer 44 of the metamorphic substrate 45 with the sacrificial layer 42 in between, and then the semiconductor device 1 may be formed through the use of the ELO technique for stripping off the sacrificial layer 42.

Second Modification

In the above-described embodiment, the device layer 21 is fixed to the supporting substrate 10 by bonding the extraction electrodes 34 and the electrodes 11 to each other. However, the device layer 21 may be fixed to the supporting substrate 10 as below. For example, the device layer 21 may be fixed to the supporting substrate 10 by bonding to the flat surface 35A of the protective film 35 and the flat supporting substrate 10 on which the electrodes 11 are not formed before forming the holes 39, the emitter electrode 33, the base electrode 32 and the collector electrode 31 in the protective film 35. At this time, an adhesive resin layer may be arranged between the flat surface 35A and the supporting substrate 10.

APPLICATION EXAMPLES

Figure 18:
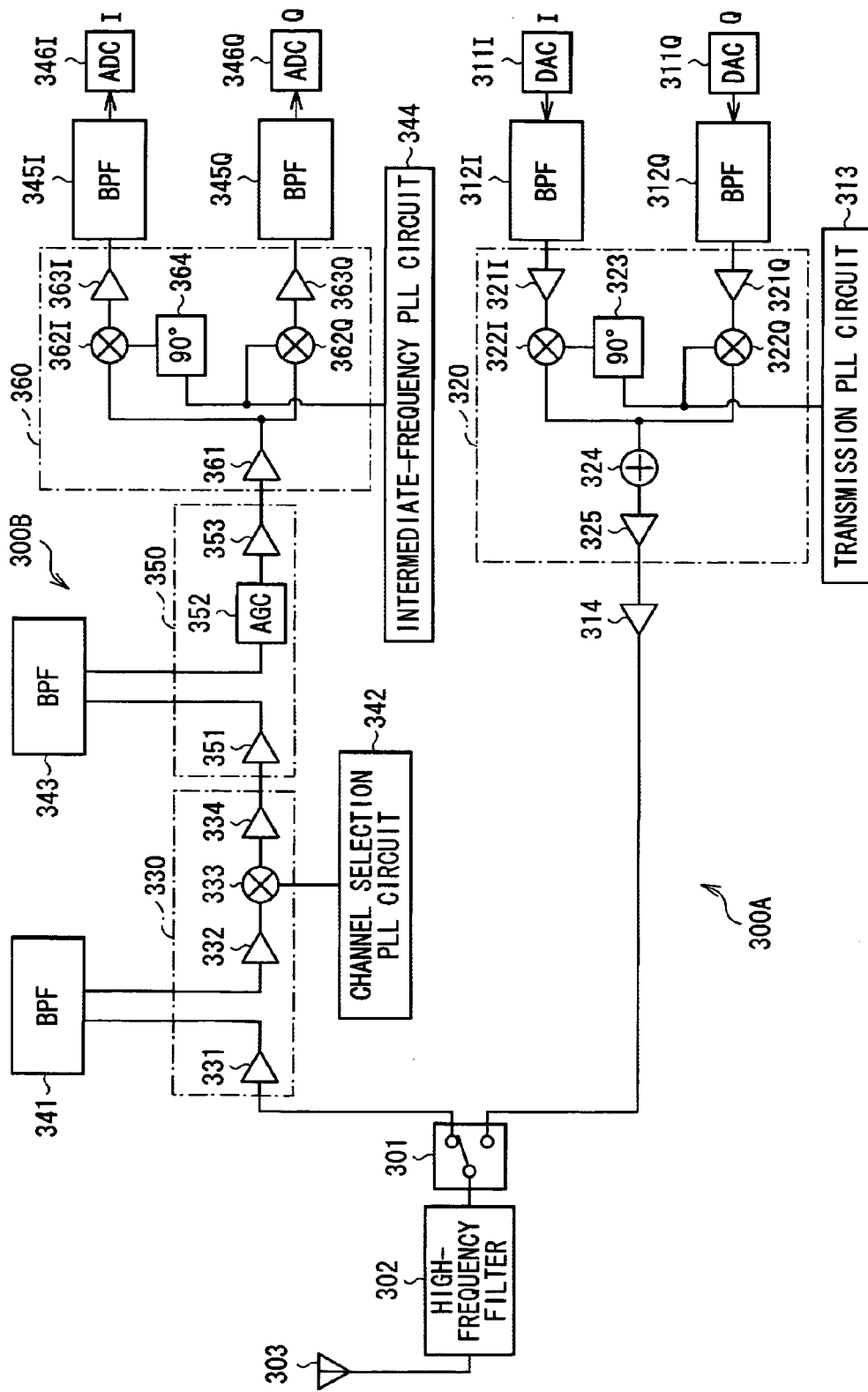
FIG. 18 is a schematic view of an electronic device according to an application example.

Next, an example of the configuration of an electronic device in which the semiconductor device 1 according to the above-described embodiment is mounted will be described below referring to FIG. 18. FIG. 18 illustrates a block diagram of the electronic device.

The electronic device illustrated in FIG. 18 includes the semiconductor device 1 according to the above-described embodiment as a power amplifier 314, and the electronic device is, for example, a cellular phone, a personal digital assistant (PDA), a wireless LAN device or the like. For example, as illustrated in FIG. 18, the electronic device includes a transmitting circuit 300A, a receiving circuit 300B, a transmission/reception switching device 301 switching a transmission/reception path, a high-frequency filter 302 and a transmitting/receiving antenna 303.

The transmitting circuit 300A includes two digital/analogue converter (DACs) 311I and 311Q and two BPFs (bandpass filters) 312I and 312Q corresponding to I-channel transmission data and Q-channel transmission data, respectively, a modulator 320 and a transmission PLL (Phase-Locked Loop) circuit 313, and the power amplifier 314. The modulator 320 includes two buffer amplifiers 321I and 321Q and two mixers 322I and 322Q corresponding to the above-described two BPFs 312I and 312Q, respectively, a phase shifter 323, an adder 324 and a buffer amplifier 325.

The receiving circuit 300B includes a high-frequency section 330, a BPF 341 and a channel selection PLL circuit 342, an intermediate-frequency circuit 350 and a BPF 343, a demodulator 360 and an intermediate-frequency PLL circuit 344, and two BPFs 345I and 345Q and two analogue/digital converters (ADC) 346I and 346Q corresponding to I-channel reception data and Q-channel reception data, respectively. The high-frequency section 330 includes a low-noise amplifier 331, buffer amplifiers 332 and 334 and a mixer 333, and the intermediate-frequency circuit 350 includes buffer amplifiers 351 and 353 and an auto gain controller (AGC) circuit 352. The demodulator 360 includes a buffer amplifier 361, two mixers 362I and 362Q and two buffer amplifiers 363I and 363Q corresponding to the above-described two BPFs 345I and 345Q, respectively, and a phase shifter 364.

In the electronic device, when I-channel transmission data and Q-channel transmission data are inputted into the transmitting circuit 300A, each of the transmission data is processed by the following steps. First, the transmission data are converted into analog signals in the DACs 311I and 311Q, and signal components outside a band of a transmission signal are removed from the analog signals in the BPFs 312I and 312Q, then the analog signals are supplied to the modulator 320. Next, in the modulator 320, the analog signals are supplied to the mixers 322I and 322Q through the buffer amplifiers 321I and 321Q, and the analog signals are modulated by mixing the analog signals with frequency signals corresponding to a transmission frequency supplied from the transmission PLL circuit 313 to form mixed signals, and then the mixed signal are added in the adder 324 to form a single-system transmission signal. At this time, the frequency signal supplied to the mixer 322I is shifted by 90° in the phase shifter 323, thereby an I-channel signal and a Q-channel signal are quadrature modulated with each other. Finally, the single-system transmission signal is supplied to the power amplifier 314 through the buffer amplifier 325, and is amplified to predetermined transmission power. The signal amplified in the power amplifier 314 is supplied to the antenna 303 through the transmission/reception switching device 303 and the high-frequency filter 302, and then the signal is wirelessly transmitted by the antenna 303. The high-frequency filter 302 functions as a band-pass filter which removes a signal component outside a frequency band of a transmitted or received signal in the electronic device.

On the other hand, when a signal is received from the antenna 303 into the receiving circuit 300B through the high-frequency filter 302 and the transmission/reception switching device 301, the signal is processed by the following steps. First, in the high-frequency section 330, a reception signal is amplified by the low-noise amplifier 331, and a signal component outside a reception frequency band of the reception signal is removed in the BPF 341, and then the reception signal is supplied to the mixer 333 through the buffer amplifier 332. Next, the reception signal is mixed with a frequency signal supplied from the channel selection PPL circuit 342 to form a signal of a predetermined transmission channel, and the signal is converted into an intermediate-frequency signal, and then the intermediate-frequency signal is supplied to the intermediate-frequency circuit 350 through the buffer amplifier 334. Next, in the intermediate-frequency circuit 350, the intermediate-frequency signal is supplied to the BPF 343 through the buffer amplifier 351, and a signal component outside a band of the intermediate-frequency signal is removed. Then, the intermediate-frequency signal is converted into a substantially uniform gain signal in the AGC circuit 352, and then the gain signal is supplied to the demodulator 360 through the buffer amplifier 353. Next, in the demodulator 360, the gain signal is supplied to the mixers 362I and 362Q through the buffer amplifier 361, and then the gain signal is mixed with frequency signals supplied from the intermediate-frequency PPL circuit 344 so as to demodulate an I-channel signal component and a Q-channel signal component. At this time, the frequency signal supplied to the mixer 362I is shifted by 90° in the phase shifter 364, thereby the I-channel signal component and the Q-channel signal component which are quadrature modulated with each other are demodulated. Finally, the I-channel signal and the Q-channel signal are supplied to BPFs 345I and 345Q, respectively, to remove signal components except for the I-channel signal and the Q-channel signal, and then the I-channel signal and the Q-channel signal are supplied to ADCs 346I and 346Q, respectively, to form digital data. Thereby, I-channel reception data and Q-channel reception data are obtained.

In the electronic device, the semiconductor device 1 according to the above-described embodiment is mounted as the power amplifier 314, so not only a high current amplification factor or high resistance to pressure but also high-speed operation and low-voltage operation may be achieved.

Although the present invention is described referring to the embodiment and the modifications and the application examples of the embodiment. However, the invention is not limited to the above-described embodiment and the like, and procedures or the like relating to the method of manufacturing the semiconductor device according to the invention may be freely modified as long as the same effects as those in the above-described embodiment and the like are obtainable.

The present application contains subject matter related to that disclosed in Japanese Priority Patent Application JP 2008-099242 filed in the Japanese Patent Office on Apr. 7, 2008, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A method of manufacturing a semiconductor device comprising:
   a formation step of forming a sacrificial layer which is pseudomorphic to InP on an InP substrate, and then forming an InP-based device layer on the sacrificial layer, the sacrificial layer being an InAlAs layer having at least In, Al and As; and
   a separation step of separating the InP substrate and the device layer from each other by etching the sacrificial layer, the device layer including a plurality of semiconductor layers,
   wherein the In composition ratio of the InAlAs layer is lower than the In composition ratio of a layer including In out of the plurality of semiconductor layers,
   wherein the sacrificial layer has a laminate configuration formed by laminating an AlAs layer and the InAlAs layer in order from the InP substrate side.

2. The method of manufacturing a semiconductor device according to claim 1, wherein
   the In composition ratio of the InAlAs layer is within a range of greater than 0 to 0.2 inclusive, and
   the In composition ratio of the layer including In out of the plurality of semiconductor layers is within a range of 0.50 to 0.56 both inclusive.

3. The method of manufacturing a semiconductor device according to claim 1, wherein
   the device layer includes an InAlAs layer, an InGaAs layer, an InGaAlAs layer or an InGaAlAs layer which is lattice-matched to InP.

4. The method of manufacturing a semiconductor device according to claim 1, wherein
   in the separation step, the InP substrate is stripped off from the device layer by etching the sacrificial layer through the use of a hydrofluoric acid.

5. The method of manufacturing a semiconductor device according to claim 1, wherein
the In composition ratio of the InAlAs layer is continuously or stepwisely increased toward the device layer side.

6. The method of manufacturing a semiconductor device according to claim 1, wherein
the thickness of the InAlAs layer is within a range of greater than 3 nm to 5 nm inclusive.

7. The method of manufacturing a semiconductor device according to claim 1, wherein
the thickness of the InAlAs layer is within a range of greater than 3 nm to 4 nm inclusive.

8. The method of manufacturing a semiconductor device according to claim 1, wherein
the sacrificial layer has a laminate configuration formed by laminating an AlAs layer and the InAlAs layer in order from the InP substrate side.

9. The method of manufacturing a semiconductor device according to claim 1, wherein
in the separation step, the device layer is covered with a protective film for preventing the device layer from being etched together with the sacrificial layer during etching of the sacrificial layer, and then the InP substrate is stripped off from the device layer by etching the sacrificial layer.

* * * * *